(12) United States Patent
Lee

(10) Patent No.: US 11,755,147 B2
(45) Date of Patent: Sep. 12, 2023

(54) DISPLAY DEVICE HAVING TOUCH SENSOR

(71) Applicant: ACONIC INC., Gwangju (KR)

(72) Inventor: Min Jae Lee, Gwangju (KR)

(73) Assignee: ACONIC INC., Gwangju (KR)

( * ) Notice: Subject to any disclaimer, the term of this patent is extended or adjusted under 35 U.S.C. 154(b) by 0 days.

(21) Appl. No.: 17/632,451

(22) PCT Filed: Aug. 19, 2019

(86) PCT No.: PCT/KR2019/010484
§ 371 (c)(1),
(2) Date: Feb. 2, 2022

(87) PCT Pub. No.: WO2021/025221
PCT Pub. Date: Feb. 11, 2021

(65) Prior Publication Data
US 2022/0276760 A1    Sep. 1, 2022

(30) Foreign Application Priority Data

Aug. 8, 2019 (KR) .................. 10-2019-0096597

(51) Int. Cl.
*G06F 3/041* (2006.01)
*G06F 3/044* (2006.01)
(Continued)

(52) U.S. Cl.
CPC .......... *G06F 3/04182* (2019.05); *G06F 3/044* (2013.01); *G06F 3/04184* (2019.05);
(Continued)

(58) Field of Classification Search
CPC ... G06F 3/0142; G06F 3/04182–04184; G06F 3/014; G09G 2320/0276; G09G 2320/0673; G09G 2320/0285
See application file for complete search history.

(56) References Cited

U.S. PATENT DOCUMENTS

2004/0095402 A1* 5/2004 Nakano ................ G09G 3/3406
346/102
2017/0108991 A1* 4/2017 Noh ...................... G06F 3/0446

FOREIGN PATENT DOCUMENTS

JP    2009-110418 A    5/2009
KR   10-2013-0116425 A   10/2013
(Continued)

*Primary Examiner* — Sanjiv D. Patel
(74) *Attorney, Agent, or Firm* — NKL Law; Jae Youn Kim

(57) ABSTRACT

Provided is a display device having a touch sensor capable of improving touch sensitivity by removing the influence of display noise. The display device includes: a display panel including pixels connected to data lines and scan lines; a scan driver for supplying scan signals to the pixels through the scan lines; a data driver for receiving digital image data, converting the digital image data into an analog data signal, and supplying the analog data signal to the pixels through the data lines; a data variance calculator for calculating a variance in image data for each data channel by using the digital image data, and summing the variance in image data for each data channel to calculate an integrated data variance value; and a plurality of correction value calculators for calculating a touch correction value for each sensing channel by using the integrated data variance value.

14 Claims, 14 Drawing Sheets

(51) Int. Cl.
*G09G 3/3266* (2016.01)
*G09G 3/3275* (2016.01)
*H10K 59/40* (2023.01)

(52) U.S. Cl.
CPC ......... *G09G 3/3266* (2013.01); *G09G 3/3275* (2013.01); *H10K 59/40* (2023.02); *G09G 2300/0857* (2013.01); *G09G 2310/027* (2013.01); *G09G 2310/0278* (2013.01); *G09G 2320/0276* (2013.01)

(56) References Cited

FOREIGN PATENT DOCUMENTS

| | | |
|---|---|---|
| KR | 10-1317227 B1 | 10/2013 |
| KR | 10-1891763 B1 | 8/2018 |
| KR | 101891763 B1 * | 8/2018 |
| KR | 10-1903527 B1 | 10/2018 |

* cited by examiner

DISPLAY DEVICE HAVING TOUCH SENSOR

TECHNICAL FIELD

The present invention relates to a display device having a touch sensor, and more particularly, to a display device having a touch sensor capable of improving touch sensitivity by removing the influence of display noise.

BACKGROUND ART

As interest in information display increases and the demand for using portable information media increases, research and commercialization of a display device have been focused on.

Examples of such a display device include a liquid crystal display device, a field emission display device, a plasma display device, an organic light emitting display device, and the like.

Among them, the organic light emitting display device displays an image using an organic light emitting diode that generates light by recombination of electrons and holes, which has advantages of having a fast response speed and being driven with low power consumption.

A recent display device includes a touch sensor for receiving a user's touch as well as an image display function. Accordingly, the user can more conveniently use the display device through the touch sensor.

Among various types of touch sensors that have been used, a capacitive touch sensor is capable of determining a touch position by detecting a point where capacitance changes by the touch of a person's hand or an object. The capacitive touch sensor easily detects multi-touch and has excellent accuracy, so that it has been widely used in recent years.

However, with the introduction of a flexible organic light emitting display device and the trend toward miniaturization and thinness, the spatial distance between a display panel and the touch sensor has been reduced, and accordingly, the magnitude of display driving noise induced to the touch sensor has increased, reaching a level at which desired touch sensing sensitivity cannot be obtained.

DISCLOSURE

Technical Problem

An object of the present invention is to provide a display device having a touch sensor capable of improving touch sensitivity by removing the influence of display noise.

Technical Solution

According to the features of the present invention for achieving the above object, the present invention may include: a display panel including pixels connected to data lines and scan lines, each pixel having a light emitting element; a scan driver configured to supply scan signals to the pixels through the scan lines; a data driver configured to receive digital image data, convert the digital image data into an analog data signal, and supply the analog data signal to the pixels through the data lines; a data variation calculator configured to obtain variations in image data for each data channel by using the digital image data, and calculate an integrated data variation value by adding up the variations in the image data for each data channel; a plurality of correction value calculators configured to calculate a touch correction value for each sensing channel by using the integrated data variation value; a touch sensing unit including driving electrodes and detection electrodes that cross each other; a touch driver configured to supply a touch driving signal to the driving electrodes; and a plurality of touch correction circuits configured to perform noise removal for each sensing channel by using detection signals received from the touch sensing unit and the touch correction value for each sensing channel received from the correction value calculators.

In addition, the data variation calculator may include: a variation detector configured to detect variations in image data for each data channel in a previous horizontal period and a next horizontal period by using the digital image data; and a variation summer configured to calculate the integrated data variation value by adding up the variations in the image data for each data channel detected by the variation detector.

In addition, each of the correction value calculators may include: a modulator configured to modulate the integrated data variation value; an integrator configured to integrate the integrated data variation value received from the modulator for a preset period to calculate the touch correction value; and a flip-flop circuit configured to receive the touch correction value and supply the touch correction value to a corresponding touch correction circuit in response to a sampling clock.

In addition, the modulator may perform a modulation operation using the touch driving signal.

In addition, each of the touch correction circuits may include: an amplification unit connected to at least one detection electrode and configured to output a sensing signal reflecting a change in capacitance of the detection electrode; an analog-to-digital converter configured to convert the sensing signal of the amplification unit into a digital signal to output it; and a noise removal unit configured to calculate touch data by subtracting a value obtained by multiplying the touch correction value of a corresponding flip-flop circuit by a correction coefficient from the sensing signal received from the analog-to-digital converter.

In addition, each of the touch correction circuits may include: a demodulator configured to demodulate an $i^{th}$ detection signal and an $(i+1)^{th}$ detection signal received from an $i^{th}$ detection electrode and an $(i+1)^{th}$ detection electrode adjacent to each other; a differential amplification unit configured to receive demodulated $i^{th}$ detection signal and $(i+1)^{th}$ detection signal from the demodulator to output a sensing signal; an analog-to-digital converter configured to convert the sensing signal into a digital signal to output it; and a noise removal unit configured to calculate touch data by subtracting a value obtained by multiplying the touch correction value of a corresponding flip-flop circuit by a correction coefficient from the sensing signal received from the analog-to-digital converter.

In addition, the analog-to-digital converter may perform a sampling operation in response to the sampling clock.

In addition, the demodulator may perform a demodulation operation of the $i^{th}$ detection signal and the $(i+1)^{th}$ detection signal by using the touch driving signal.

In addition, the sampling clock may be synchronized with a horizontal synchronization signal.

In addition, the present invention may further include a frequency multiplier configured to receive the horizontal synchronization signal as an input signal and output the sampling clock as an output signal.

In addition, the present invention may further include a correction coefficient calculator configured to calculate the correction coefficient.

In addition, the correction coefficient calculator may update the correction coefficient by using a least mean square (LMS) algorithm.

In addition, the display device may include dummy pixels having no light emitting element, the data variation calculator may obtain variations in image data for each data channel with respect to the dummy pixels by using the digital image data during a driving period of the dummy pixels, and calculate a dummy data variation value by adding up the variations of the image data for each data channel with respect to the dummy pixels, the correction value calculator may calculate a dummy correction value for each sensing channel by using the dummy data variation value, and the correction coefficient calculator may calculate the correction coefficient for each sensing channel by using the dummy correction value for each sensing channel, a first signal outputted from the analog-to-digital converter during a driving period of the dummy pixels, and a second signal outputted from the analog-to-digital converter during a non-driving period of the pixels and the dummy pixels.

In addition, the data variation calculator may include: a gamma compensator configured to perform gamma correction on the digital image data with reference to a preset gamma table; a variation detector configured to detect variations in image data for each data channel in a previous horizontal period and a next horizontal period by using the digital image data corrected by the gamma compensator; and a variation summer configured to calculate the integrated data variation value by adding up the variations of the image data for each data channel detected by the variation detector.

In addition, each of the correction value calculators may include: a filter configured to perform a digital filtering operation on the integrated data variation value; a modulator configured to modulate the integrated data variation value transmitted through the filter; an integrator configured to integrate the integrated data variation value received from the modulator for a preset period to calculate the touch correction value; and a flip-flop circuit configured to receive the touch correction value and supply the touch correction value to a corresponding touch correction circuit in response to a sampling clock.

Advantageous Effects

According to the present invention as described above, it is possible to provide a display device having a touch sensor capable of improving touch sensitivity by removing the influence of display noise.

BEST MODE

Figure 1:
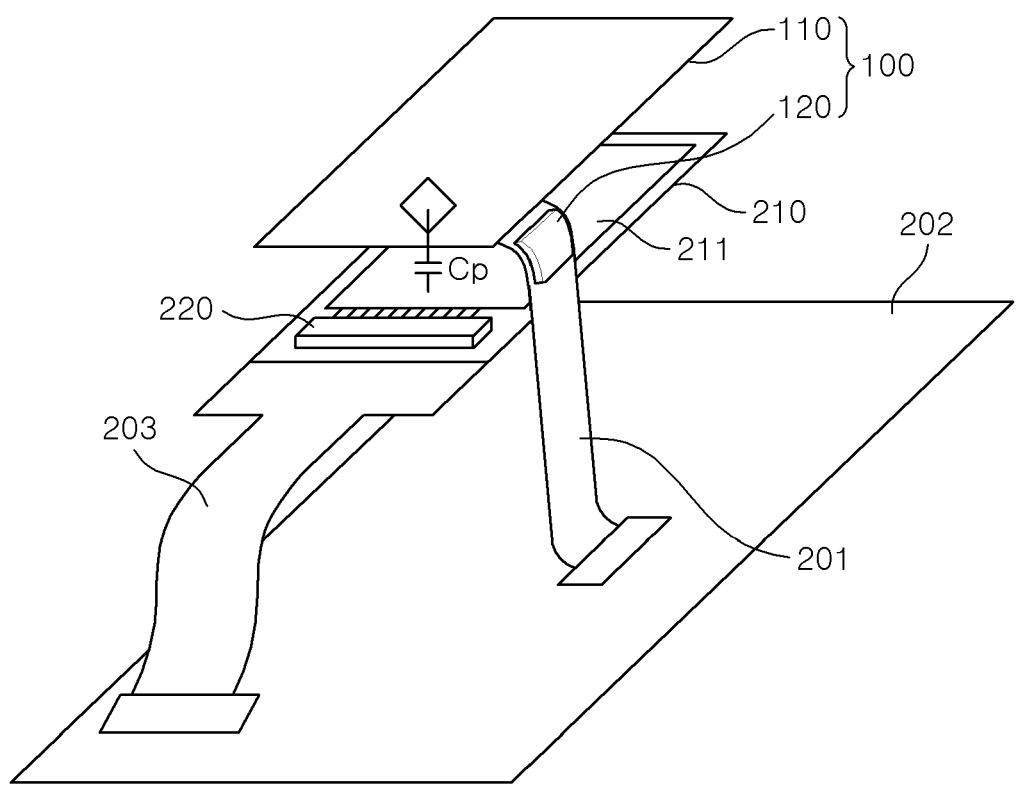
FIG. 1 is a diagram schematically showing a display device including a touch sensor according to an embodiment of the present invention.

Hereinafter, embodiments related to the present invention are illustrated in the drawings and will be described in detail through detailed description. However, the present invention is not limited to embodiments disclosed below, but may be implemented in a variety of different forms, and should be understood to include all changes, equivalents, and substitutes included in the spirit and technical scope of the present invention.

In describing the components of the present invention, terms such as first, second, A, B, (a), (b), and the like may be used. These terms are merely for distinguishing an element from other elements, and the essence, sequence, or order of the corresponding element are not restricted by the terms. In addition, herein, when it is described that an element is "connected" or "combined" to/with another element, the element may be connected or combined directly to/with the another element, but it should be understood that still another element may also be "connected" or "combined" between the above elements. In the case of being "connected" or "combined", it may be understood as being physically "connected" or "combined" as well as being "connected" or "combined" electrically as necessary.

As used herein, terms such as "~ unit", "~er", and the like mean a unit that processes at least one function or operation, and these may be implemented with hardware, software, or a combination of hardware and software. Further, terms such as "include", "comprise" or "have" used herein mean that a corresponding component may be incorporated unless otherwise stated, so it should be construed as being able to further include other components rather than excluding other components.

In addition, it is intended to clarify that the classification of the constituent parts in the present invention is merely a division for each main function that each constituent part is responsible for. That is, two or more components to be described below may be combined into one component, or one component may be divided into two or more components according to more subdivided function. Further, each of the constituent parts to be described below may additionally perform some or all of the functions of another constituent part in addition to the main function that the constituent part is responsible for. In addition, some of the main functions that each constituent part is responsible for may be exclusively performed by another constituent part.

Hereinafter, a display device having a touch sensor according to an embodiment of the present invention will be described with reference to the drawings related to embodiments of the present invention.

Figure 2:
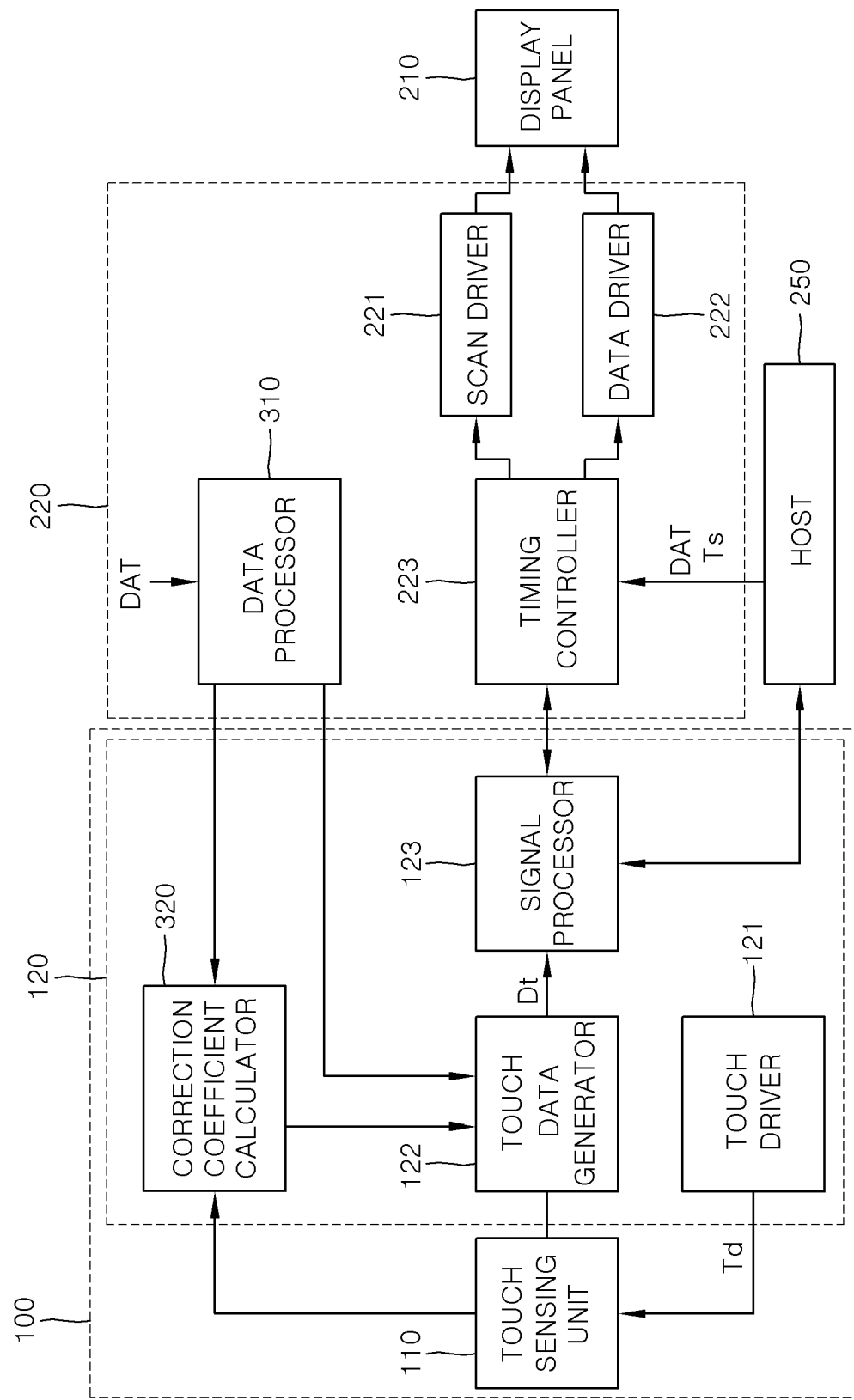
FIG. 2 is a diagram illustrating in detail the configuration of a display device having a touch sensor according to an embodiment of the present invention.

FIG. 1 is a diagram schematically showing a display device having a touch sensor according to an embodiment of the present invention. FIG. 2 is a diagram showing in detail the configuration of a display device having a touch sensor according to an embodiment of the present invention.

Referring to FIGS. 1 and 2, a display device having a touch sensor according to an embodiment of the present invention may include a touch sensor 100, a display panel 210, a display driving circuit 220, and a host 250.

The touch sensor 100 may include a touch sensing unit 110 and a touch control unit 120.

The touch sensing unit 110 may be positioned above the display panel 210 to perform a role of receiving a touch of a user. In addition, a plurality of electrodes may be provided to sense a change in capacitance due to the touch.

The touch control unit 120 may control the touch sensing unit 110, and may detect the occurrence and location of a touch event by sensing a change in capacitance of the touch sensing unit 110.

That is, the touch sensor 100 including the touch sensing unit 110 and touch control unit 120 described above may operate as a capacitive touch sensor.

The touch sensing unit 110 may be connected to a main flexible printed circuit board (FPCB) 202 through a first FPCB 201, and the touch control unit 120 may be formed in the form of an integrated circuit and located on the first FPCB 201.

Accordingly, the touch sensing unit 110 may transmit/receive a signal to/from the host 250 located at the main FPCB 202.

However, the location of the touch control unit 120 is not limited thereto, and the touch control unit 120 may be disposed in another location such as the main FPCB 202.

The display panel 210 may include a plurality of pixels, and may display a predetermined image through the pixels.

For example, the display panel 210 may display an image under the control of the display driving circuit 220.

As an example, the display panel 210 may be implemented as an organic light emitting display panel.

The display driving circuit 220 may control an image display operation of the display panel 210 by supplying a display driving signal to the display panel 210.

The display driving circuit 220 may generate the display driving signal by using digital image data DAT and a timing signal TS supplied from the outside.

For example, the display driving circuit 220 may receive the image data DAT and the timing signal TS from the host 250, and the timing signal TS may include a vertical synchronization signal, a horizontal synchronization signal, a main clock signal, a data enable signal, and the like.

In addition, the display driving signal may include a scan signal, a data signal, and the like.

For example, the display driving circuit 220 may be formed in the form of an integrated circuit and mounted on the display panel 210. In addition, the display driving circuit 220 may be connected to the main FPCB 202 through a second FPCB 203, and accordingly, the display driving circuit 220 may transmit/receive a signal to/from the host 250 located at the main FPCB 202.

However, the location of the display driving circuit 220 is not limited thereto, and for example, the display driving circuit 220 may be connected to the display panel 210 through a separate component (e.g., FPCB).

The touch control unit 120 and the display driving circuit 220 may be separately located as shown in the drawing, but the present invention is not limited thereto. That is, the touch control unit 120 and the display driving circuit 220 may be integrated into one chip. In addition, a data processor 310 and a correction coefficient calculator 320 may, as shown in the drawing, be included in the display driving circuit 220 and the touch control unit 120, respectively, but the present invention is not limited thereto.

The host 250 may exchange data with the touch control unit 120 and the display driving circuit 220 through an interface. For example, the host 250 and the touch control unit 120 may exchange data with each other through a low-frequency control interface such as I2C for transmitting touch coordinate information, and the host 250 and the display driving circuit 220 may use a high-speed data interface such as MIPI to transmit image data.

In order to follow a trend toward miniaturization and thinning of the display device and to implement flexible characteristics, the spatial distance between the touch sensing unit 110 and the display panel 210 has been reduced, and accordingly, the influence of a parasitic capacitance Cp existing between the touch sensing unit 110 and the display panel 210 has also been increased.

Since this parasitic capacitance Cp mainly exists between a touch electrode included in the touch sensing unit 110 and a power source surface 211 included in the display panel 210, and a voltage drop (IR Drop) is generated on the power source surface 211 according to a pixel operation, there has occurred a problem that the display noise through the power source surface 211 is induced to the touch sensing unit 110, making unable to obtain desired touch sensing sensitivity.

Further, ideally, the same noise should be expressed commonly in all touch sensing channels, but the actual noise expressed is different for each sensing line due to RC mismatch of each sensing line.

Accordingly, in order to further remove a noise component caused by the RC mismatch of the sensing channel, the present invention intends to utilize the data processor 310 and a touch data generator 122.

In detail, the data processor 310 may calculate a touch correction value for each sensing channel using the digital image data. The touch data generator 122 may effectively remove a noise component caused by RC mismatch of each sensing line by utilizing for touch sensing compensation a certain ratio of the touch correction value for each sensing channel through a correction coefficient calculated by the correction coefficient calculator 320.

Referring to FIG. 2, the touch control unit 120 according to an embodiment of the present invention may include a touch driver 121, the touch data generator 122, and a signal processor 123. In addition, the touch control unit 120 may further include the correction coefficient calculator 320.

The touch driver 121 may supply a touch driving signal Td to the touch sensing unit 110 to drive the touch sensor 100.

The touch data generator 122 may include a plurality of touch correction circuits connected to the touch sensing unit 110 to perform noise removal using detection signals received from detection electrodes of the touch sensing unit 110.

In this case, the touch data generator 122 may perform noise removal using the touch correction value for each sensing channel transmitted from the data processor 310 and the correction coefficient transmitted from the correction coefficient calculator 320, thereby generating a final touch data Dt.

The signal processor 123 may perform an overall control operation of the touch sensor 100 in relation to the touch operation.

The signal processor 123 performs a predetermined logical operation based on the touch data Dt received from the touch data generator 122 to determine whether a touch operation has been performed on the touch screen and where the touch operation has been performed.

The correction coefficient calculator 320 may provide the correction coefficient used in the noise removal processing.

Meanwhile, the display driving circuit 220 according to an embodiment of the present invention may include a scan driver 221, a data driver 222, and a timing controller 223. In addition, the display driving circuit 220 may further include a data processor 310.

The scan driver 221 may supply a scan signal to the display panel 210, and the data driver 222 may supply a data signal to the display panel 210.

The timing controller 223 may control the operations of the scan driver 221 and the data driver 222, and for this purpose, may receive the digital image data DAT and the timing signal TS from the host 250.

The data processor 310 may use the digital image data to obtain variations in image data for each data channel, may add up the variations in the image data for each data channel to calculate an integrated data variation value, and may use the integrated data variation value to calculate the touch correction value for each sensing channel.

Figure 3:
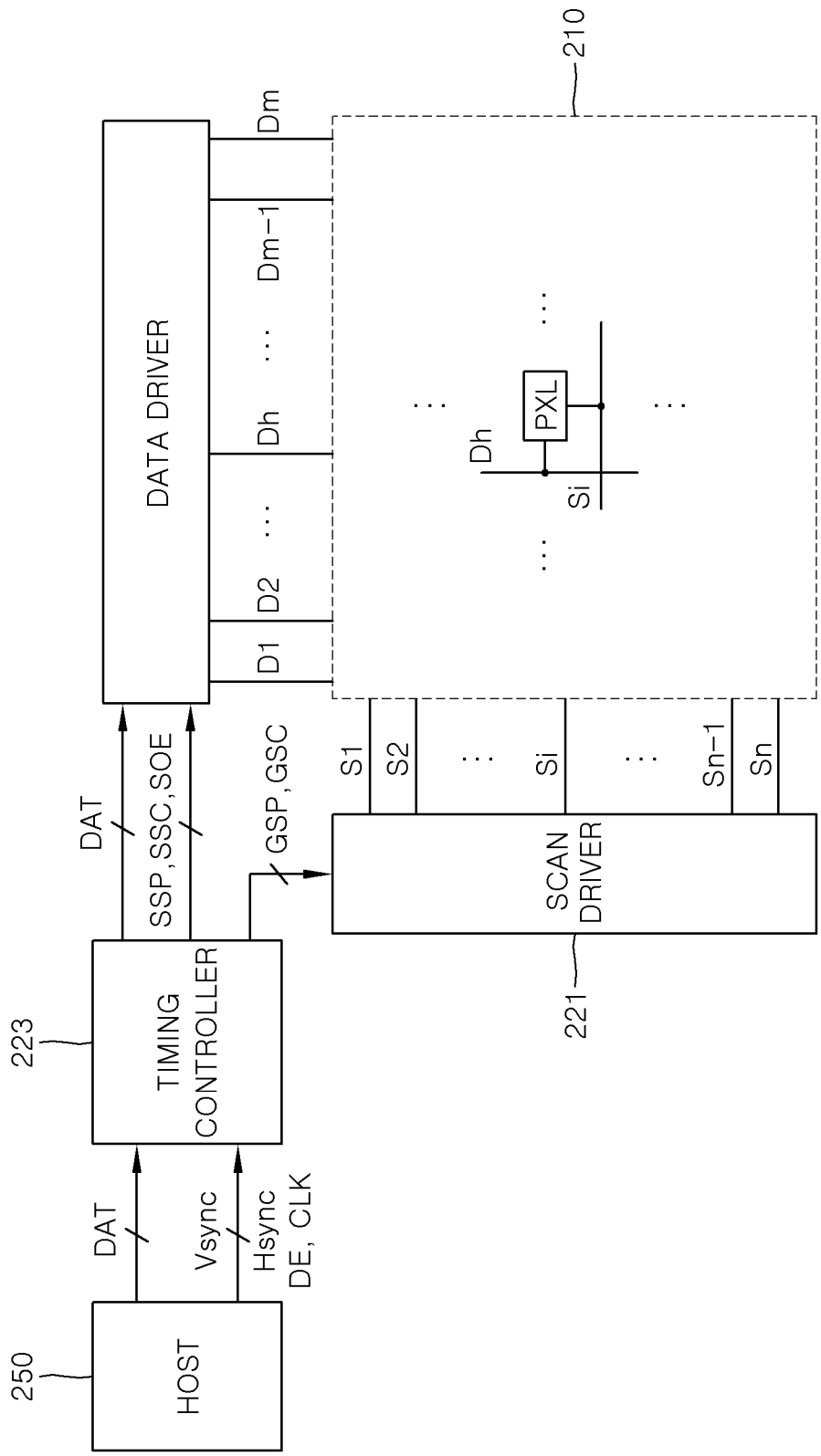
FIG. 3 is a diagram illustrating in more detail a display panel and a display driving circuit according to an embodiment of the present invention.

FIG. 3 is a diagram illustrating in more detail a display panel and a display driving circuit according to an embodiment of the present invention.

Referring to FIG. 3, the display panel 210 may include a plurality of pixels PXL arranged to be connected to data lines D1 to Dm and scan lines S1 to Sn. In this case, each of the pixels PXL may include a light emitting element that outputs light having a predetermined luminance to the outside in response to a data signal.

For example, in the case of one pixel PXL connected to an $i^{th}$ scan line Si and a $h^{th}$ data line Dh, the above pixel PXL may be selected when a scan signal is supplied to the $i^{th}$ scan line Si, to receive a data signal from the $h^{th}$ data line Dh. Thereafter, a driving transistor included in the above pixel PXL may supply a current corresponding to the data signal to an organic light emitting diode, and accordingly, the organic light emitting diode may generate light having a predetermined luminance.

Additionally, although it is illustrated in FIG. 3 that the pixel PXL is connected to one data line Dh and one scan line Si, the present invention is not limited thereto. As an example, various signal lines may be additionally connected to correspond to the circuit structure of the pixel PXL. In addition, in an embodiment of the present invention, each pixel PXL may be implemented in various forms that are currently known.

The data driver 222 may generate data signals by using the digital image data DAT inputted from the timing controller 223. The data signals generated by the data driver 222 may be supplied to the data lines D1 to Dm via a buffer circuit (not shown) located in each data channel. That is, the data driver 222 may output the data signals for each data channel, and transmit the data signals to the pixels PXL through the data lines D1 to Dm connected one-to-one to the data channels.

The scan driver 221 may supply scan signals to the scan lines S1 to Sn. As an example, the scan driver 221 may sequentially supply the scan signals to the scan lines S1 to Sn. When the scan signals are sequentially supplied to the scan lines S1 to Sn, the pixels PXL may be selected on a horizontal line basis. The data signal supplied to the data lines D1 to Dm may be supplied to the pixels PXL selected by the scan signal.

Based on the digital image data DAT and the timing signal TS such as a vertical synchronization signal Vsync, a horizontal synchronization signal Hsync, a data enable signal DE, and a clock signal CLK, outputted from the host 250, the timing controller 223 may supply a gate control signal to the scan driver 221 and supply a data control signal to the data driver 222.

The gate control signal may include a gate start pulse GSP and one or more gate shift clocks GSC. The gate start pulse GSP may control the timing of the first scan signal, and the gate shift clock GSC may refer to one or more clock signals for shifting the gate start pulse GSP.

The data control signal may include a source start pulse SSP, a source sampling clock SSC, a source output enable SOE, and the like. The source start pulse SSP may control a data sampling start time of the data driver 222, and the source sampling clock SSC may control a sampling operation of the data driver 222 based on a rising or falling edge. In addition, the source output enable SOE may control the output timing of the data driver 222.

The host 250 may supply the image data DAT to the timing controller 223 through a predetermined interface. In addition, the host 250 may supply the timing signals Vsync, Hsync, DE, and CLK to the timing controller 223.

Figure 4:
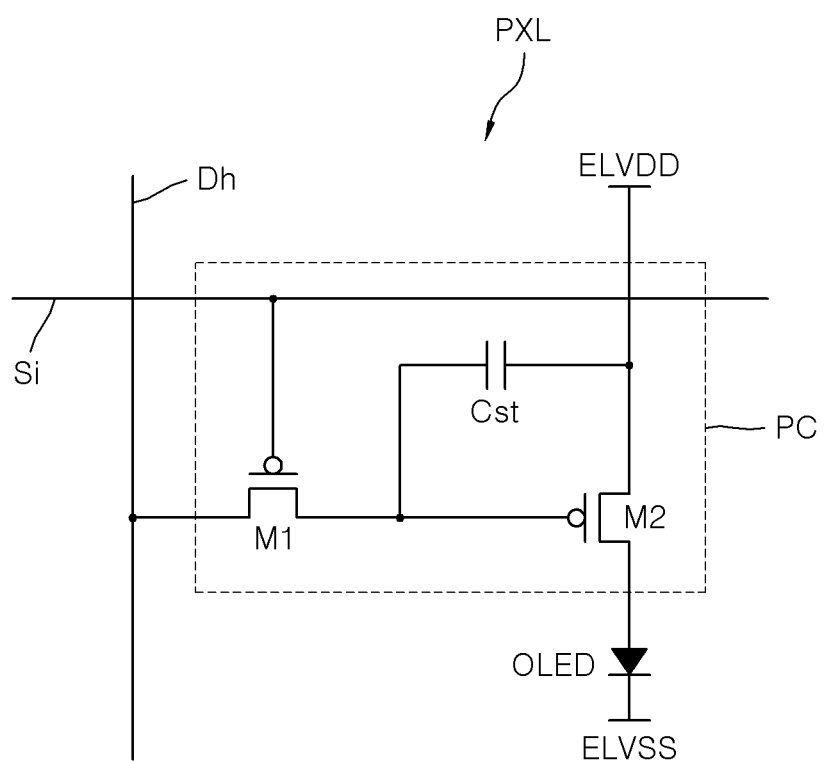
FIG. 4 is a diagram illustrating an example of a pixel illustrated in FIG. 3.

FIG. 4 is a diagram illustrating one example of a pixel illustrated in FIG. 3.

In particular, for simplicity of description, the pixel PXL connected to the $i^{th}$ scan line Si and the $h^{th}$ data line Dh is illustrated in FIG. 4.

First, referring to FIG. 4, the pixel PXL includes an organic light emitting diode OLED which is a light emitting element, and a pixel circuit PC connected to the $h^{th}$ data line Dh and the $i^{th}$ scan line Si to control the organic light emitting diode OLED.

The anode electrode of the organic light emitting diode OLED may be connected to the pixel circuit PC, and the cathode electrode thereof may be connected to a second power source ELVSS.

Such an organic light emitting diode OLED may generate light having a predetermined luminance in response to a current supplied from the pixel circuit PC.

The pixel circuit PC may store a data signal supplied to the $h^{th}$ data line Dh when a scan signal is supplied to the $i^{th}$ scan line Si, and in response to the stored data signal, may control the amount of current supplied to the organic light emitting diode OLED.

For example, the pixel circuit PC may include a first transistor M1, a second transistor M2, and a storage capacitor Cst.

The first transistor M1 may be connected between the $h^{th}$ data line Dh and the second transistor M2.

For example, in the first transistor M1, the gate electrode may be connected to the $i^{th}$ scan line Si, the first electrode may be connected to the $h^{th}$ data line Dh, and the second electrode may be connected to the gate electrode of the second transistor M2.

The first transistor M1 may be turned on when the scan signal is supplied from the $i^{th}$ scan line Si to supply the data signal from the $h^{th}$ data line Dh to the storage capacitor Cst.

In this case, the storage capacitor Cst may be charged with a voltage corresponding to the data signal.

The second transistor M2 may be connected between a first power source ELVDD and the organic light emitting diode OLED.

For example, in the second transistor M2, the gate electrode may be connected to the first electrode of the storage capacitor Cst and the second electrode of the first transistor M1, the first electrode may be connected to the second electrode of the storage capacitor Cst and the first power source ELVDD, and the second electrode may be connected to the anode electrode of the organic light emitting diode OLED.

The second transistor M2 is a driving transistor, and may control the amount of current flowing from the first power source ELVDD to the second power source ELVSS via the organic light emitting diode OLED in response to a voltage value stored in the storage capacitor Cst.

In this case, the organic light emitting diode OLED may generate light corresponding to the amount of current supplied from the second transistor M2.

Here, the first electrode of the transistors M1 and M2 may be set as one of the source electrode and the drain electrode, and the second electrode of the transistors M1 and M2 may be set as an electrode different from the first electrode. For example, when the first electrode is set as the source electrode, the second electrode may be set as the drain electrode.

In addition, the transistors M1 and M2 are illustrated as PMOS transistors in FIG. 4, but in another embodiment, the transistors M1 and M2 may be implemented as NMOS transistors.

Figure 5:
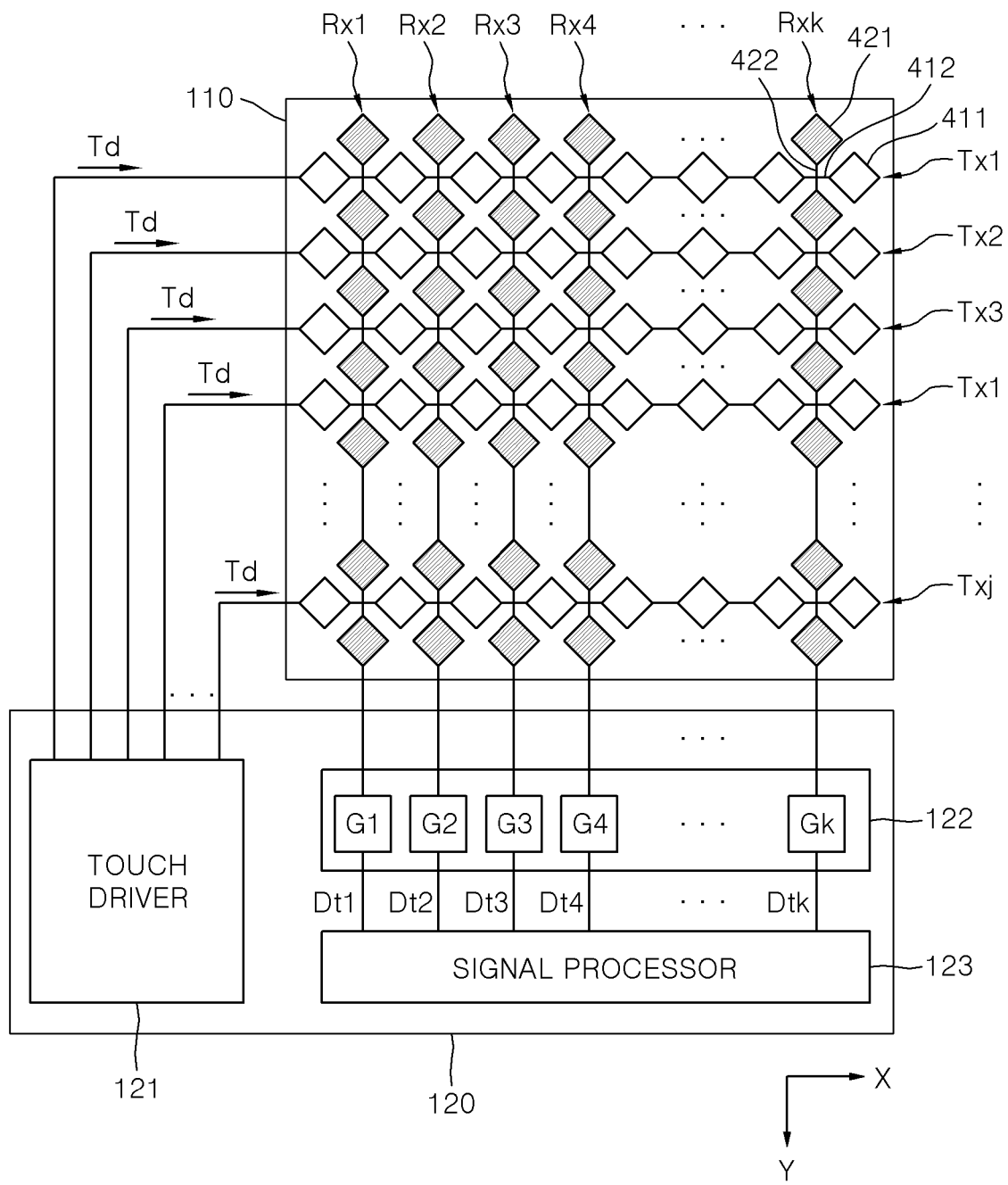
FIG. 5 is a diagram illustrating in more detail a touch sensing unit and a touch control unit according to an embodiment of the present invention.

FIG. 5 is a diagram illustrating in more detail a touch sensing unit and a touch control unit according to an embodiment of the present invention.

Referring to FIG. 5, the touch sensing unit 110 may include a plurality of touch electrodes Tx and Rx.

For example, the touch electrodes Tx and Rx may include a plurality of driving electrodes (or, referred to as transmitting electrodes) Tx1 to Txj and a plurality of detection electrodes (or, referred to as receiving electrodes) Rx1 to Rxk.

The driving electrodes Tx1 to Txj may be elongated in a first direction (e.g., X-axis direction) and arranged along a second direction (e.g., Y-axis direction) intersecting the first direction.

The detection electrodes Rx1 to Rxk may be elongated in the second direction (e.g., Y-axis direction) and arranged along the first direction (e.g., X-axis direction).

The driving electrodes Tx1 to Txj and the detection electrodes Rx1 to Rxk may be positioned to cross each other, thereby operating as a capacitive touch sensor.

That is, mutual capacitance exists between the driving electrodes Tx1 to Txj and the detection electrodes Rx1 to Rxk, and when a touch occurs on the display device, the mutual capacitance of a position associated with the touch changes. A touch position may be detected by detecting such a change in capacitance.

Each of the driving electrodes Tx1 to Txj may include a plurality of first touch sensing cells 411 arranged at predetermined intervals along the first direction (e.g., X-axis direction), and a plurality of first connection patterns 412 that electrically connect the first touch sensing cells 411 to each other.

In addition, each of the detection electrodes Rx1 to Rxk may include a plurality of second touch sensing cells 421 arranged at predetermined intervals along the second direction (e.g., Y-axis direction), and a plurality of second connection patterns 422 that electrically connect the second touch the sensing cells 421 to each other.

In this case, the second touch sensing cells 421 may be dispersedly disposed between the first touch sensing cells 411 so as not to overlap the first touch sensing cells 411.

Although the first touch sensing cells 411 and the second touch sensing cells 421 are illustrated to have a polygonal shape in FIG. 5, the shapes of the first touch sensing cells 411 and the second touch sensing cells 421 may be variously modified.

The driving electrodes Tx1 to Txj and the detection electrodes Rx1 to Rxk may include a conductive material. For example, they may include a metal or an alloy of metals. Examples of the metal may include gold (Au), silver (Ag), aluminum (Al), molybdenum (Mo), chromium (Cr), titanium (Ti), nickel (Ni), neodymium (Nd), copper (Cu), platinum (Pt), and the like.

In addition, the driving electrodes Tx1 to Txj and the detection electrodes Rx1 to Rxk may be formed of a transparent conductive material. Examples of the transparent conductive material may include silver nanowires (AgNW), indium tin oxide (ITO), indium zinc oxide (IZO), antimony zinc oxide (AZO), indium tin zinc oxide (ITZO), zinc oxide (ZnO), tin oxide (SnO2), carbon nanotube, graphene, and the like. Each of the driving electrodes Tx1 to Txj and the detection electrodes Rx1 to Rxk may be formed of a single layer or multiple layers. The driving electrodes Tx1 to Txj and the detection electrodes Rx1 to Rxk may be made of the same material or different materials.

The driving electrodes Tx1 to Txj and the detection electrodes Rx1 to Rxk may be disposed on a substrate (not shown). The substrate may be implemented as a separate substrate or may be implemented with various components included in the display device. For example, the substrate may be an encapsulation layer of the display panel 210 described above.

That is, the touch sensor 100 may be designed in an on-cell method. For example, the touch sensing unit 110 may be disposed above the display panel 210.

The touch driver 121 may supply the touch driving signal Td to the touch sensing unit 110 to drive the touch sensor 100.

For example, the touch driver 121 may sequentially supply the touch driving signal Td from a first driving electrode Tx1 to a $j^{th}$ driving electrode Txj. However, the present invention is not limited thereto, and the touch driver 121 may supply the touch driving signal Td in a time-division manner according to a different order, or may simultaneously supply the touch driving signal Td to the plurality of driving electrodes according to the characteristics of the touch driving signal Td.

The touch data generator 122 may include a plurality of touch correction circuits G1 to Gk that perform noise removal using detection signals received from the detection electrodes Rx1 to Rxk.

The touch correction circuits G1 to Gk may be electrically connected to the detection electrodes Rx1 to Rxk, respectively, and may generate touch data Dt1 to Dtk by removing display noise from the received detection signals.

The signal processor 123 performs a predetermined logical operation based on the touch data Dt1 to Dtk received from the touch data generator 122 to determine whether a touch operation has been performed on the touch screen and where the touch operation has been performed.

In addition, the signal processor 123 may perform a control operation on the touch data generator 122 described above.

Figure 6:
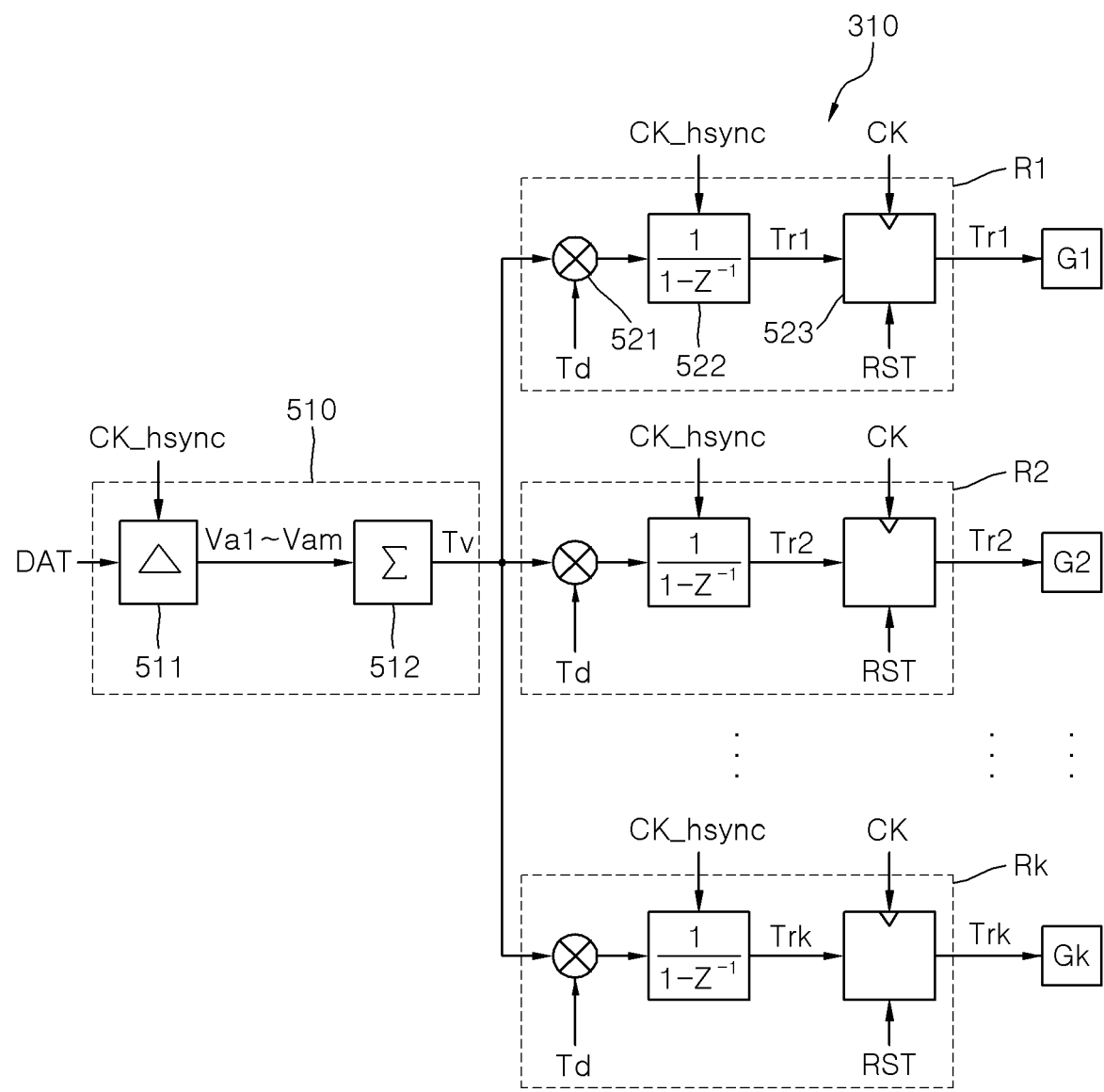
FIG. 6 is a diagram illustrating a data processor according to an embodiment of the present invention.

FIG. 6 is a diagram illustrating a data processor according to an embodiment of the present invention.

Referring to FIG. 6, the data processor 310 according to an embodiment of the present invention may include a data variation calculator 510 and a plurality of correction value calculators R1 to Rk.

The data variation calculator 510 may obtain variations Va1 to Vam in image data for each data channel using the digital image data DAT inputted from the outside, and may calculate an integrated data variation value Tv by adding up the variations Va1 to Vam in the image data for each data channel.

In this case, the variations Va1 to Vam in the image data for each data channel may be determined as a difference between image data for each data channel when a previous scan signal $((n-1)^{th}$ scan signal) according to the horizontal synchronization signal Hsync of each display screen is supplied and image data for each data channel when a next scan signal ($n^{th}$ scan signal) is supplied.

For example, an image data variation Vah of a $h^{th}$ data channel may be calculated as a difference between digital image data allocated to the $h^{th}$ data channel in response to the previous scan signal $((n-1)^{th}$ scan signal) and digital image data allocated to the $h^{th}$ data channel in response to the next scan signal ($n^{th}$ scan signal).

For this purpose, the data variation calculator 510 may include a variation detector 511 and a summer 512.

The variation detector 511 may detect the variations Va1 to Vam in the image data for each data channel by using the digital image data DAT. For example, when there are m data channels, the variation detector 511 may detect the variations Va1 to Vam in the image data for each of the m channels by using the digital image data DAT for each of the m channels.

Since the digital image data DAT for each data channel continuously changes when the display is driven, the variation detector 511 may continuously monitor the variations in the image data per unit time with reference to a synchronization clock CK_hsync to provide the detected variation information to the summer 512. That is, the variation detector 511 may recognize a previous horizontal period and a next horizontal period through the clock CK_hsync synchronized with the horizontal synchronization signal Hsync, and may detect variations between image data for each data channel in the previous horizontal period and image data for each data channel in the next horizontal period, thereby detecting the variations Va1 to Vam of the image data for each data channel.

The summer 512 may calculate the integrated data variation value Tv by adding up the variations Va1 to Vam of the image data for each data channel detected by the variation detector 511.

The correction value calculators R1 to Rk may calculate touch correction values Tr1 to Trk for noise compensation for each sensing channel, and may provide the calculated touch correction values Tr1 to Trk for each sensing channel to the corresponding touch correction circuits G1 to Gk, respectively.

Each of the correction value calculators R1 to Rk may include a modulator 521, an integrator 522, and a flip-flop circuit 523.

The modulator 521 may modulate the integrated data variation value Tv transmitted from the data variation calculator 510 and provide it to the integrator 522. In this case, the modulator 521 may perform a modulation operation on the integrated data variation value Tv using the touch driving signal Td.

The integrator 522 may integrate the integrated data variation value Tv received from the modulator 521 for a preset period to calculate the touch correction value Tr1 to Trk. That is, the integrated data variation value Tv is a value obtained by integrating the variations in image data of all data channels into one, and it continuously changes according to the horizontal period. The integrator 522 may integrate these changing integrated data variation value Tv for a predetermined period, thereby estimating a value corresponding to the common display noise transmitted to the touch sensing unit 110 through the power source surface 211 of the display panel 210.

In this case, the integrator 522 may be initialized in response to a reset signal RST, and may operate in synchronization with the synchronization clock CK_hsync.

The flip-flop circuit 523 may include at least one flip-flop, and may receive the touch correction value Tr1 to Trk for each sensing channel from the integrator 522 to generate an output signal in response to the sampling clock CK.

That is, the flip-flop circuit 523 may sample the received touch correction value Tr1 to Trk for each sensing channel in response to the sampling clock CK and transmit it to the touch correction circuit G1 to Gk.

Meanwhile, the synchronization clock CK_hsync may be set to a signal whose frequency and phase are synchronized with the horizontal synchronization signal Hsync. In addition, the digital image data DAT used to calculate the variations Va1 to Vam of the image data for each data channel may be provided from the host 250, the timing controller 223, and the like.

Figure 7:
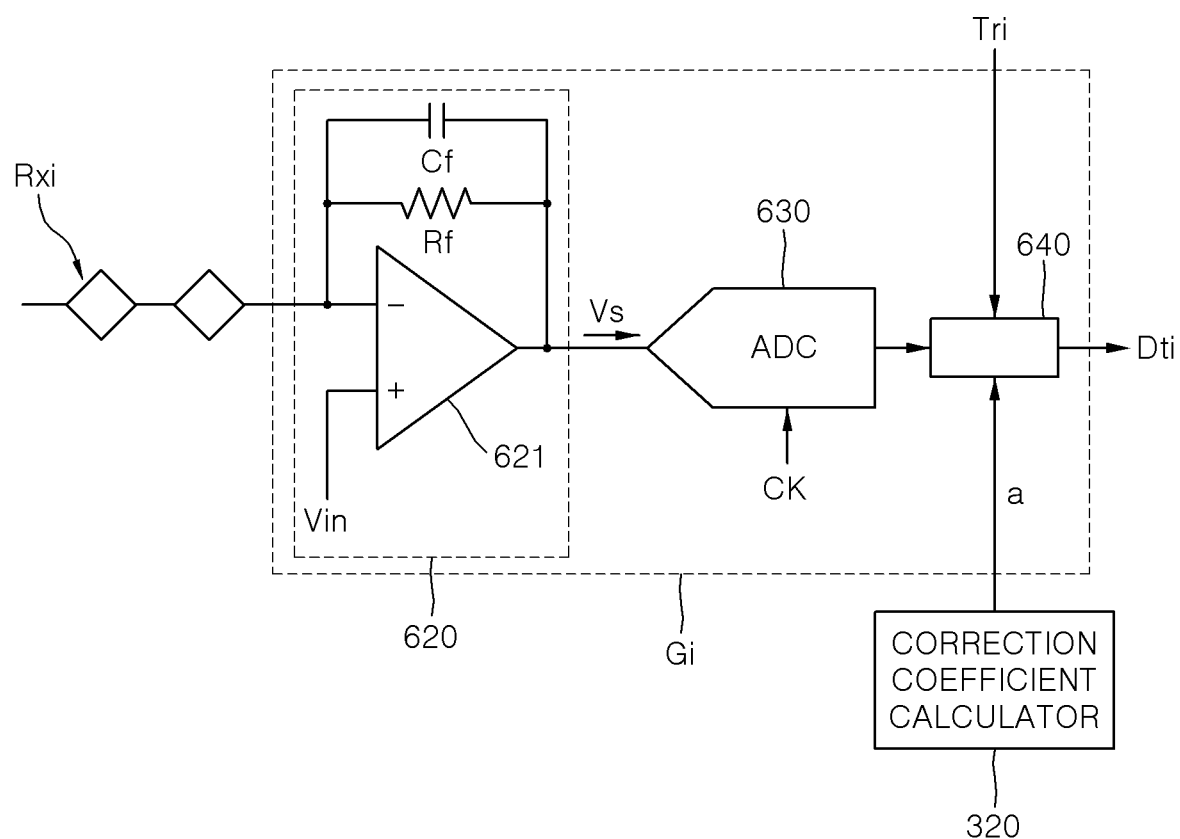
FIG. 7 is a diagram illustrating a touch correction circuit according to an embodiment of the present invention.

FIG. 7 is a diagram illustrating a touch correction circuit according to an embodiment of the present invention. In particular, FIG. 7 illustrates a touch correction circuit Gi electrically connected to an $i^{th}$ detection electrode Rxi.

Referring to FIG. 7, the touch correction circuit Gi according to an embodiment of the present invention may include an amplification unit 620, an analog-to-digital converter 630, and a noise removal unit 640.

The amplification unit 620 may be connected to the $i^{th}$ detection electrode Rxi, and may output a sensing signal Vs reflecting a capacitance change in the $i^{th}$ detection electrode Rxi. That is, the amplification unit 620 is an amplifier circuit having a predetermined voltage gain, and may be used to detect the capacitance change in the $i^{th}$ detection electrode Rxi.

In this case, the amplification unit 620 may include an amplifier 621, a resistor Rf, and a capacitor Cf.

For example, the first input terminal of the amplifier 621 may be connected to the $i^{th}$ detection electrode Rxi, and the second input terminal of the amplifier 621 may receive an input signal Vin having a predetermined frequency.

The input signal Vin may be a signal having a constant period (e.g., square wave or sine wave), and the level and frequency of the input signal Vin may be appropriately adjusted.

In addition, the capacitor Cf may be connected between the first input terminal and the output terminal of the amplifier 621, and further, the resistor Rf may be connected in parallel with the capacitor Cf.

In this case, the first input terminal of the amplifier 621 may be set as an inverting input terminal (−), and the second input terminal of the amplifier 621 may be set as a non-inverting input terminal (+).

The analog-to-digital converter 630 may receive the sensing signal Vs from the amplification unit 620, convert the received sensing signal Vs into a digital signal, and output the converted signal. In this case, the analog-to-digital converter 630 may perform a sampling operation on the sensing signal Vs in response to the sampling clock CK, and for sampling synchronization, the flip-flop circuit 523 of the correction value calculator R1 to Rk and the analog-to-digital converter 630 may operate in synchronization with the same sampling clock CK.

The noise removal unit 640 may calculate touch data Dti by subtracting a value obtained by multiplying a touch correction value Tri of a corresponding flip-flop circuit 523 by a correction coefficient "a" from the sensing signal Vs received from the analog-to-digital converter 630. This may be expressed by the following equation.

$$Dti = Vs - a*Tri$$

Here, only a noise compensation method for a sensing channel related to the $i^{th}$ detection electrode Rxi has been described, but noise compensation for sensing channels related to the other detection electrodes may also be performed in the same manner. That is, the touch correction circuits G1 to Gk may use, for touch sensing compensation, values obtained by multiplying the touch correction values Tr1 to Trk for each sensing channel transmitted from the corresponding compensation value calculators R1 to Rk by a certain ratio, thereby effectively removing a noise component caused by RC mismatch of each sensing line.

The correction coefficient "a" used for touch sensing compensation may be calculated through the correction coefficient calculator 320.

For example, the correction coefficient calculator 320 may update the correction coefficient "a" to minimize display noise by using a least mean square (LMS) algorithm.

The correction coefficient calculator 320 may calculate the correction coefficient "a" by using another method without using the known least mean square (LMS) algorithm, which will be described later.

Meanwhile, a separate demodulator (not shown) may be added to the above-described touch correction circuit Gi if necessary. In this case, the arrangement structure of the demodulator may be designed in various ways.

Figure 8:
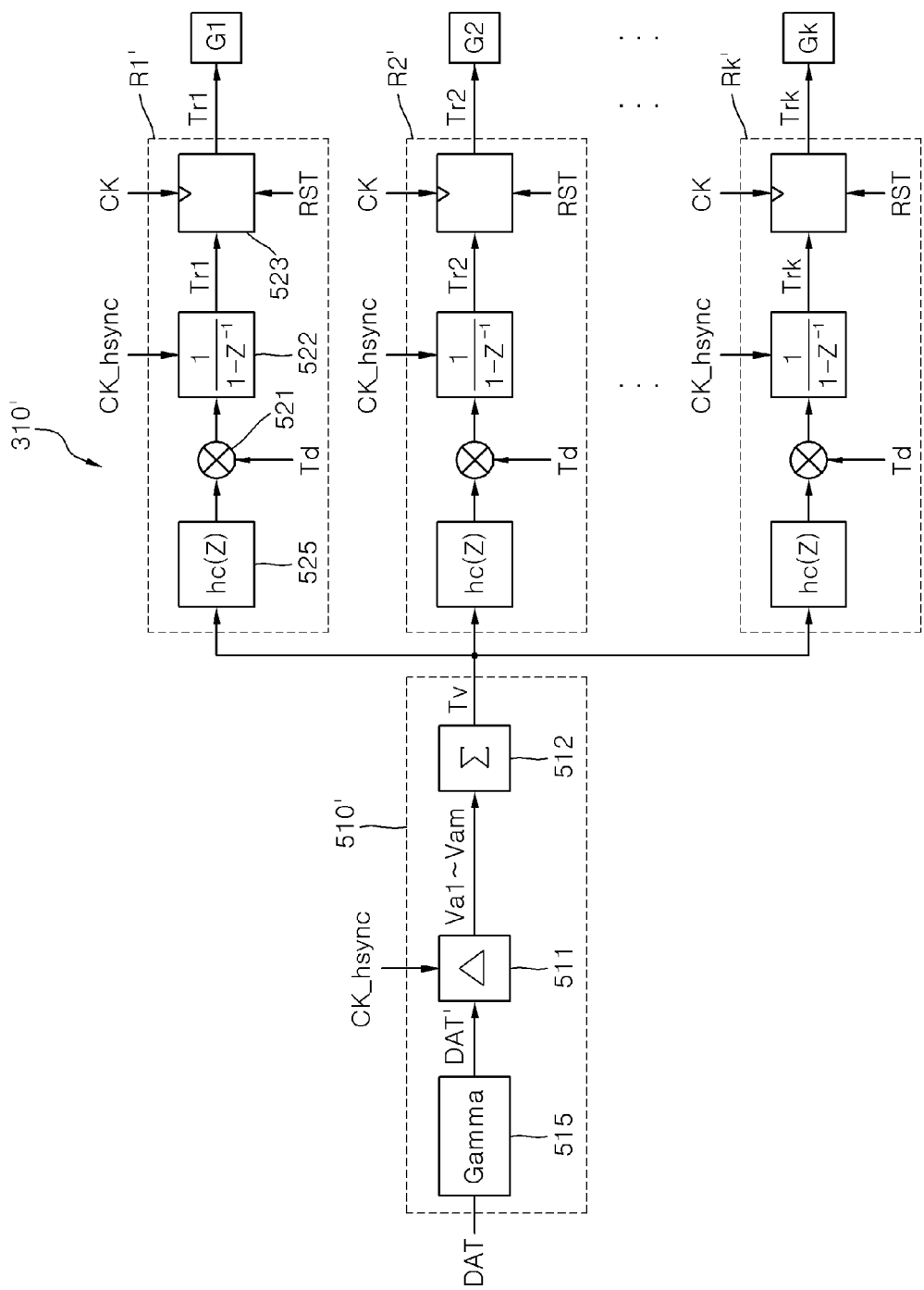
FIG. 8 is a diagram illustrating a data processor according to another embodiment of the present invention.

FIG. 8 is a diagram illustrating a data processor according to another embodiment of the present invention. A description of the content overlapping the embodiment related to FIG. 6 will be omitted.

Referring to FIG. 8, a data processor 310' according to another embodiment of the present invention may include a data variation calculator 510' and a plurality of correction value calculators R1' to Rk'.

The data variation calculator 510' may include a gamma compensator 515, the variation detector 511, and the summer 512.

The data signal supplied to the pixels PXL of the actual display panel 210 may be selected from grayscale voltages corresponding to a specific gamma curve, and in this case, the digital image data DAT may be converted into a grayscale voltage value corresponding thereto through a preset gamma look up table (LUT).

The gamma compensator 515 may perform gamma correction on the digital image data DAT to correspond to a gamma correction operation performed in the display panel 210. Specifically, the gamma compensator 515 may generate gamma-corrected digital image data DAT' with reference to the preset gamma LUT.

The variation detector 511 may detect the variations Va1 to Vam of the image data for each data channel by using the digital image data DAT' corrected by the gamma compensator 515. That is, the variation detector 511 may recognize a previous horizontal period and a next horizontal period through the synchronization clock CK_hsync, and may detect variations between image data for each data channel in the previous horizontal period and image data for each data channel in the next horizontal period, thereby detecting the variations Va1 to Vam in the image data for each data channel.

The summer 512 may calculate the integrated data variation value Tv by adding up the variations Va1 to Vam in the image data for each data channel detected by the variation detector 511.

The correction value calculators R1' to Rk' may calculate the touch correction values Tr1 to Trk for noise compensation for each sensing channel, and may provide the calculated touch correction values Tr1 to Trk for each sensing channel to the corresponding touch correction circuits G1 to Gk, respectively.

Each of the correction value calculators R1 to Rk may include a filter 525, the modulator 521, the integrator 522, and the flip-flop circuit 523.

The filter 525 may be connected to the output terminal of the summer 512, and may serve to model an impulse response of the touch sensor 100.

That is, since display noise affects not during one period but during several periods, it is necessary to have a filter capable of predicting it.

As an example, the filter 525 may be implemented as a finite impulse response (FIR) filter or an infinite impulse response (IIR) filter, which is a digital filter. In addition, since impulse response characteristics for each sensing channel are different, the characteristics of the filters 525 of the correction value calculators R1' to Rk' may also be set differently for each channel.

The filter 525 may perform a digital filtering operation on the integrated data variation value Tv and transmit the filtered integrated data variation value Tv to the modulator 521.

The modulator 521 may modulate the integrated data variation value Tv filtered by the filter 525 and provide it to the integrator 522. In this case, the modulator 521 may perform a modulation operation on the integrated data variation value Tv using the touch driving signal Td.

The integrator 522 may integrate the integrated data variation value Tv received from the modulator 521 for a preset period to calculate the touch correction value Tr1 to Trk.

The flip-flop circuit 523 may include at least one flip-flop, and may receive the touch correction value Tr1 to Trk for each sensing channel from the integrator 522 to generate an output signal in response to the sampling clock CK.

That is, the flip-flop circuit 523 may sample the received touch correction value Tr1 to Trk for each sensing channel in response to the sampling clock CK and transmit it to the touch correction circuit G1 to Gk.

Figure 9:
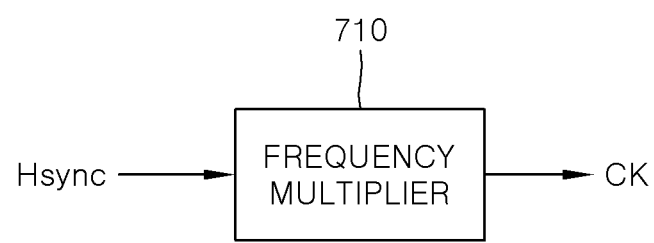
FIG. 9 is a diagram illustrating a frequency multiplier according to an embodiment of the present invention.

FIG. 9 is a diagram illustrating a frequency multiplier according to an embodiment of the present invention. Referring to FIG. 9, the display device having the touch sensor according to an embodiment of the present invention may additionally include a frequency multiplier 710.

In this case, the frequency multiplier 710 may receive the horizontal synchronization signal Hsync from the outside and output the clock CK as an output signal.

As an example, the frequency multiplier 710 may be implemented as a phase locked loop (PLL) or delay locked loop (DLL)-based frequency multiplier.

In this case, the clock CK generated by the frequency multiplier 710 may be used as the sampling clock CK for sampling control of the flip-flop circuit 520 and the analog-to-digital converter 630 described above.

In this case, the sampling clock CK may have a lower frequency than the horizontal synchronization signal Hsync and the synchronization clock CK_hsync.

Figure 10:
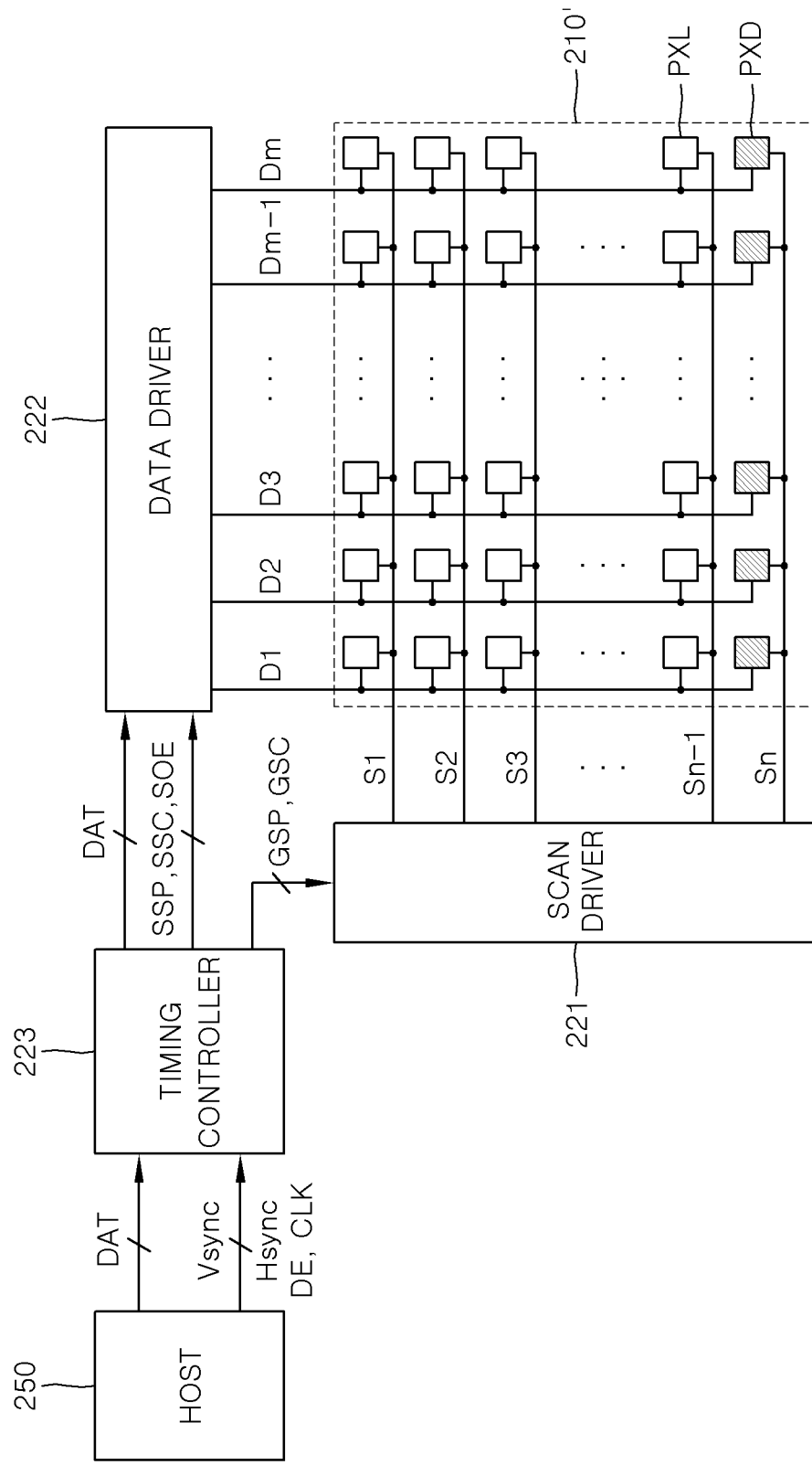
FIG. 10 is a diagram illustrating a display panel according to another embodiment of the present invention.
Figure 11:
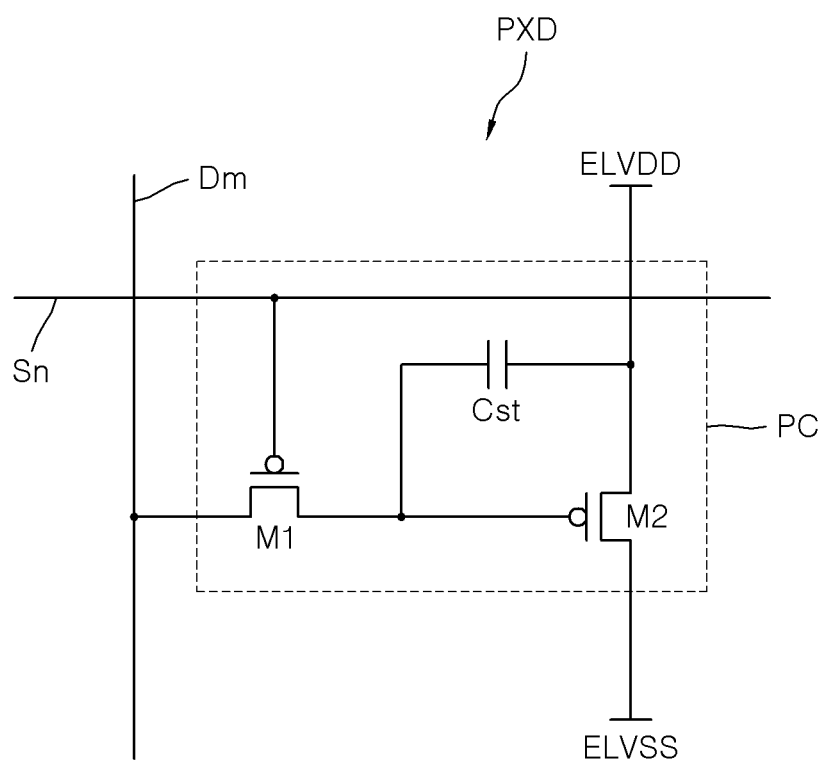
FIG. 11 is a diagram illustrating a dummy pixel of FIG. 10.

FIG. 10 is a diagram illustrating a display panel according to another embodiment of the present invention. FIG. 11 is a diagram illustrating a dummy pixel of FIG. 10. In particular, for simplicity of description, a dummy pixel PXD connected to a $n^{th}$ scan line Sn and a $m^{th}$ data line Dm is illustrated in FIG. 11.

Referring to FIG. 10, a display panel 210' according to another embodiment of the present invention may further include dummy pixels PXD having no light emitting element in addition to the pixels PXL having the light emitting element.

That is, as shown in FIG. 11, since the dummy pixel PXD does not include a separate light emitting element, a non-emission state may be maintained even if the dummy pixel PXD is normally driven.

For example, the dummy pixel PXD may include the same pixel circuit PC as that of the above-described normal pixel PXL, and thus may generate a driving current in response to an applied data signal, as in the normal pixel PXL.

Accordingly, even when the dummy pixels PXD are driven, display noise may be generated in a similar manner to when the normal pixels PXL are driven, and based on this, the correction coefficient calculator 320 may calculate the correction coefficient "a" used for the touch sensing compensation.

For example, the data variation calculator 510 of the data processor 310 may obtain the variations in the image data for each data channel with respect to the dummy pixels PXD by using the digital image data DAT transmitted from the outside during the driving period of the dummy pixels PXD, and may calculate a dummy data variation value by adding up the variations in the image data for each data channel with respect to the dummy pixels.

In this case, since the calculation method of the dummy data variation value is the same as that of the integrated data variation value Tv described above, a detailed description thereof will be omitted.

In addition, the correction value calculators R1 to Rk of the data processor 310 may calculate a dummy correction value for each sensing channel by using the dummy data variation value calculated by the data variation calculator 510.

In this case, since the calculation method of the dummy correction value for each sensing channel is the same as that of the touch correction value Tr1 to Trk for each sensing channel described above, a detailed description thereof will be omitted.

In addition, during the driving period of the dummy pixels PXD, the analog-to-digital converters 630 included in the touch correction circuits G1 to Gk may each output a first signal, and during a display non-driving period in which the pixels PXL and the dummy pixels PXD do not operate, the analog-to-digital converters 630 included in the touch correction circuits G1 to Gk may each output a second signal.

Since a difference between the first signal and the second signal outputted from the analog-to-digital converter 630 corresponds to display noise, the correction coefficient calculator 320 may calculate the correction coefficient "a" using the dummy correction value for each sensing channel, the first signal, and the second signal.

That is, the correction coefficient calculator 320 may calculate the correction coefficient "a" for each sensing channel by dividing the difference between the first signal and the second signal by the dummy correction value.

The above-described method of calculating the correction coefficient using the dummy pixel PXD may be additionally used only when the noise of the actual power source surface ELVDD/ELVSS with respect to the data variation amount is not interpreted as the data variation amount.

Figure 12:
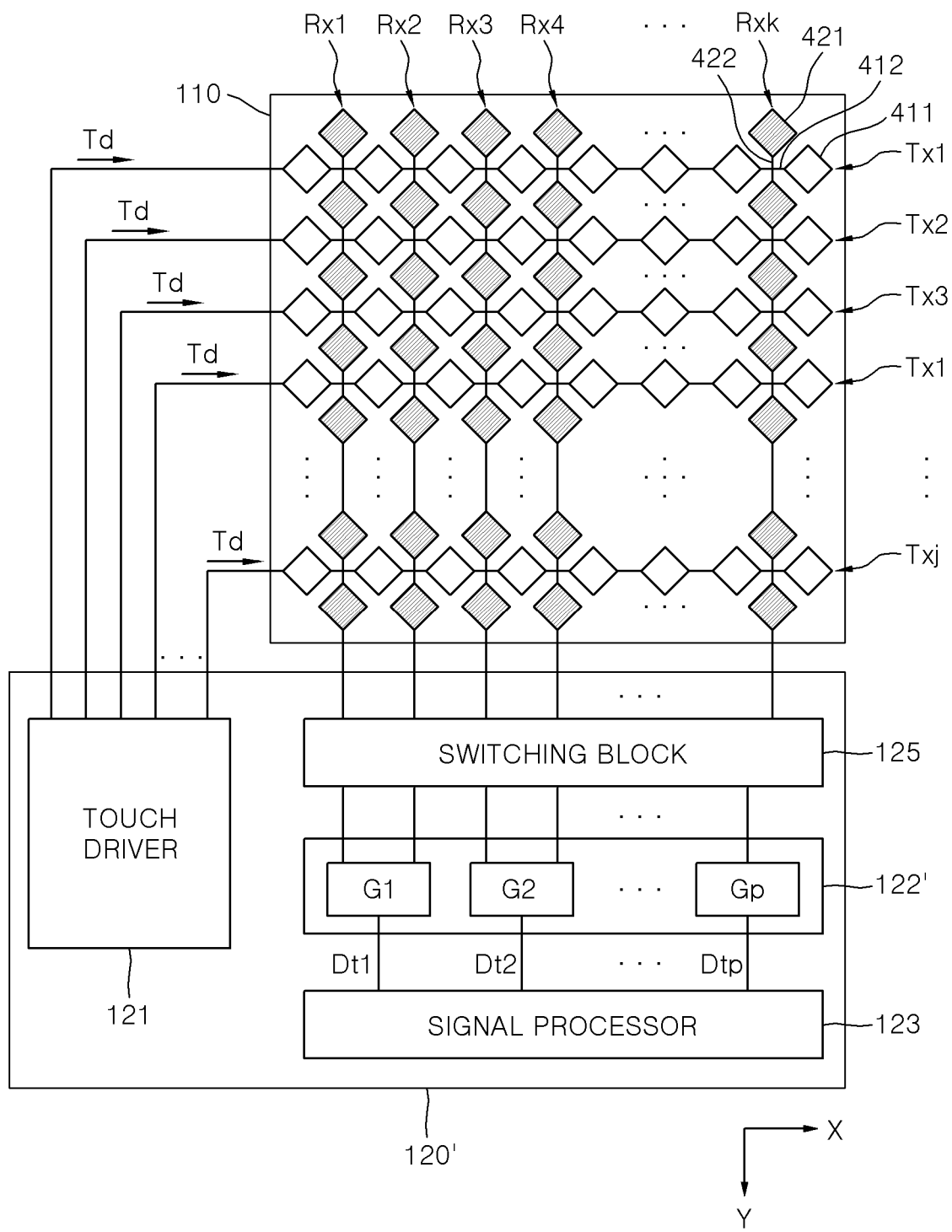
FIG. 12 is a diagram illustrating a touch control unit according to another embodiment of the present invention.

FIG. 12 is a diagram illustrating a touch control unit according to another embodiment of the present invention. A description of the content overlapping the embodiment related to FIG. 5 will be omitted.

Referring to FIG. 12, a touch control unit 120' according to another embodiment of the present invention may include the touch driver 121, a switching block 125, a touch data generator 122', and the signal processor 123.

The touch driver 121 may supply the touch driving signal Td to the touch sensing unit 110 to drive the touch sensor 100.

The switching block 125 may be connected between the touch sensing unit 110 and the touch data generator 122' to control the electrical connection state between the detection electrodes Rx1 to Rxk and touch correction circuits G1 to Gp.

As an example, the switching block 125 may operate such that each of the touch correction circuits G1 to Gp is electrically connected to two detection electrodes.

The touch data generator 122' may include the plurality of touch correction circuits G1 to Gp that perform noise removal using detection signals received from two detection electrodes adjacent to each other.

Each of the touch correction circuits G1 to Gp may be electrically connected to two detection electrodes adjacent to each other, and may generate touch data Dt1 to Dtp by removing display noise from the received detection signals.

The signal processor 123 performs a predetermined logical operation based on the touch data Dt1 to Dtp received from the touch data generator 122' to determine whether a touch operation has been performed on the touch screen and where the touch operation has been performed.

In addition, the signal processor 123 may perform a control operation on the touch data generator 122' and/or the switching block 125 described above.

Figure 13:
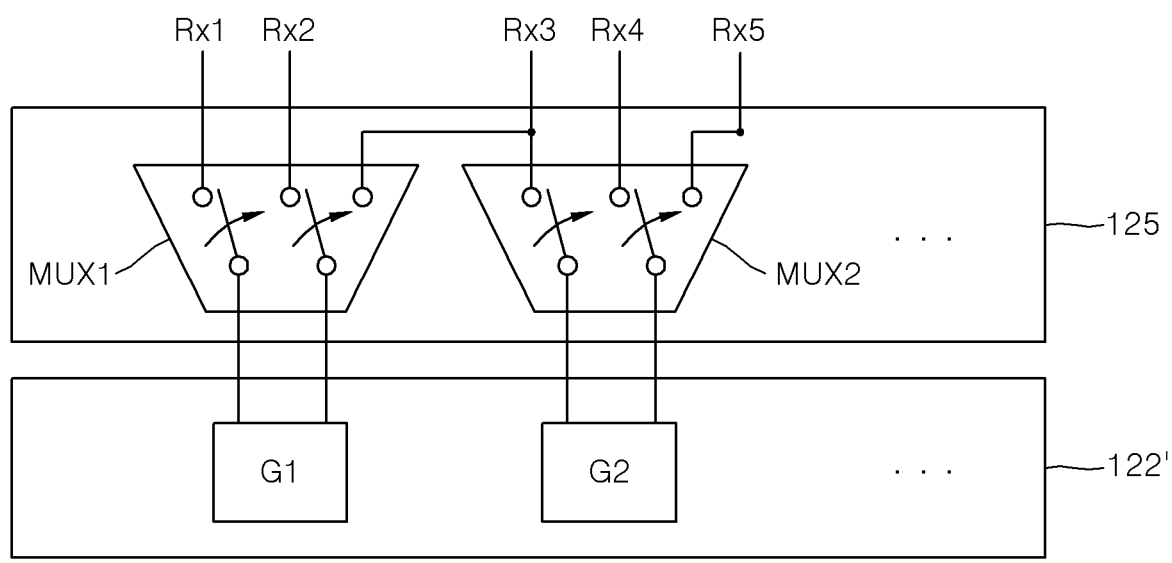
FIG. 13 is a diagram illustrating a switching block according to an embodiment of the present invention.

FIG. 13 is a diagram illustrating a switching block according to an embodiment of the present invention Referring to FIG. 13, the switching block 125 according to an embodiment of the present invention may include a plurality of multiplexers MUX1, MUX2, . . . having an input/output ratio of 3:2.

In this case, the plurality of multiplexers MUX1, MUX2, . . . operate such that two detection electrodes adjacent to each other are able to be electrically connected to each of the touch correction circuits G1 to Gp.

For example, a first multiplexer MUX1 may electrically connect a first detection electrode Rx1 and a second detection electrode Rx2, which are adjacent to each other, to a first touch correction circuit G1, or may electrically connect a second detection electrode Rx2 and a third detection electrode Rx3, which are adjacent to each other, to the first touch correction circuit G1.

Such operation of the first multiplexer MUX1 may be alternately performed by dividing the period. For example, during a first period, the first detection electrode Rx1 and the second detection electrode Rx2 may be electrically connected to the first touch correction circuit G1, and during a second period, the second detection electrode Rx2 and the third detection electrode Rx3 may be electrically connected to the first touch correction circuit G1.

Here, the first multiplexer MUX1 has been mainly described, but the other multiplexers may also be configured and operated in the same manner.

Figure 14:
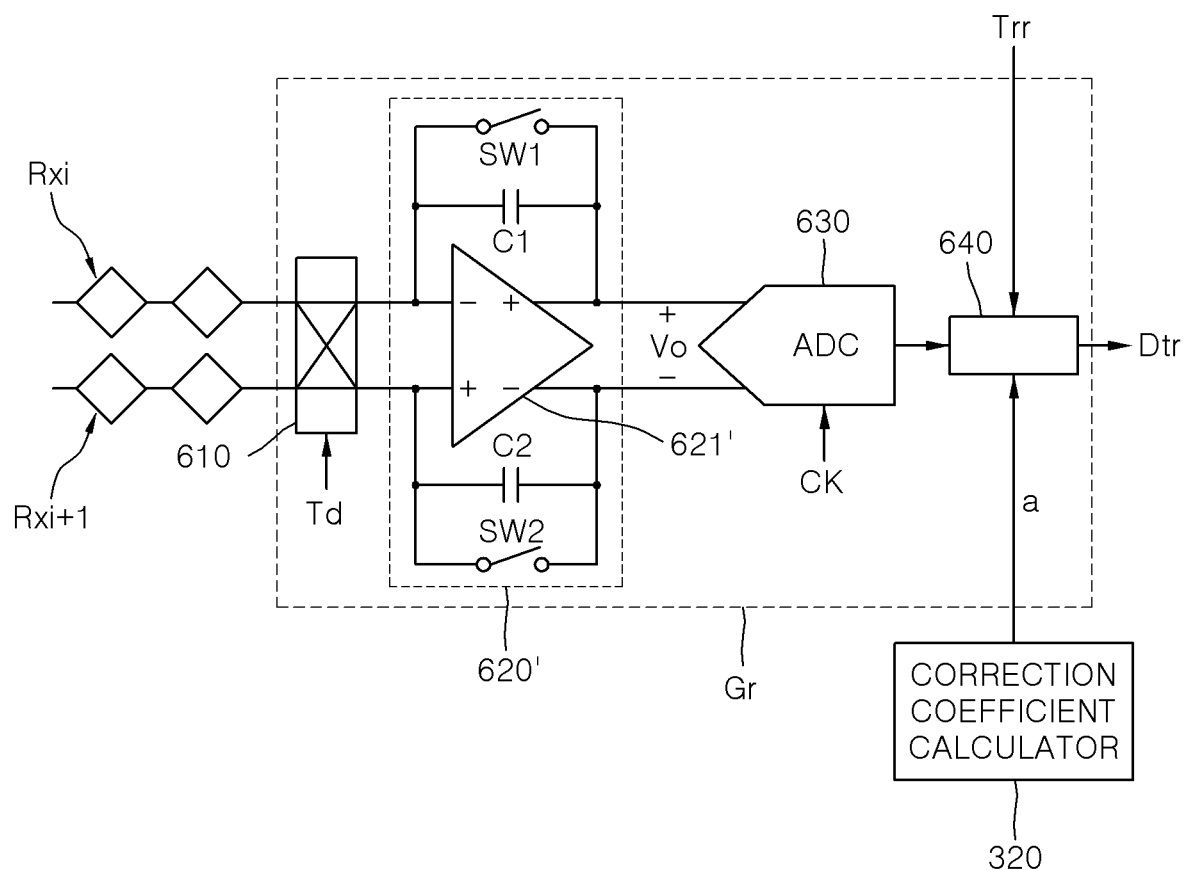
FIG. 14 is a diagram illustrating a touch correction circuit included in a touch data generator according to another embodiment of the present invention.

FIG. 14 is a diagram illustrating a touch correction circuit included in a touch data generator according to another embodiment of the present invention. In particular, FIG. 14 illustrates a touch correction circuit Gr electrically connected to an $i^{th}$ detection electrode Rxi and an $(i+1)^{th}$ detection electrode Rxi+1.

The touch correction circuit Gr may be electrically connected to the two detection electrodes Rxi and Rxi+1 adjacent to each other through the multiplexer MUX described above.

The touch correction circuit Gr may include a demodulator 610, a differential amplification unit 620', the analog-to-digital converter 630, and the noise removal unit 640.

The demodulator 610 may be electrically connected to the $i^{th}$ detection electrode Rxi and the $(i+1)^{th}$ detection electrode Rxi+1 adjacent to each other through the multiplexer MUX, and may receive an $i^{th}$ detection signal and an $(i+1)^{th}$ detection signal from the $i^{th}$ detection electrode Rxi and the $(i+1)^{th}$ detection electrode Rxi+1, respectively. Here, i may be set to an integer equal to or greater than 1.

In addition, the demodulator 610 may perform a demodulation operation on the received $i^{th}$ detection signal and $(i+1)^{th}$ detection signal by using the touch driving signal Td.

Through the demodulation operation by the demodulator 610, noise components included in the detection signals are converted into high-frequency noise components having a higher frequency than the existing frequency, and signal components excluding the noise components may be converted into a DC component signal of a constant level.

In addition, the demodulator 610 may supply the demodulated $i^{th}$ detection signal and $(i+1)^{th}$ detection signal to the differential amplification unit 620'.

The differential amplification unit 620' may receive the demodulated $i^{th}$ detection signal and $(i+1)^{th}$ detection signal from the demodulator 610 to output a sensing signal Vo.

To this end, the differential amplification unit 620' may include an amplifier 621', a first switch SW1, a first capacitor C1, a second switch SW2, and a second capacitor C2.

The first switch SW1 and the first capacitor C1 may be connected in parallel to each other between the inverting input terminal and the non-inverting output terminal of the amplifier 621', and the second switch SW2 and the second capacitor C2 may be connected in parallel to each other between the non-inverting input terminal and the inverting output terminal of the amplifier 621'.

As an example, the amplifier 621' may be implemented as a fully differential amplifier.

The differential amplification unit 620' may filter the high-frequency noise component from the demodulated $i^{th}$ detection signal and $(i+1)^{th}$ detection signal, may integrate charges corresponding to the $i^{th}$ detection signal and the $(i+1)^{th}$ detection signal from which the high-frequency noise component has been filtered, and may generate the sensing signal Vo based thereon.

The differential amplification unit 620' may be initialized through a turn-on operation of the first switch SW1 and the second switch SW2. In this case, for synchronization with the integrator 513 included in the data processor 310, the differential amplification unit 620' and the integrator 513 may be initialized at the same timing.

The analog-to-digital converter 630 may receive the sensing signal Vo from the differential amplification unit 620', and may convert the received sensing signal Vo into a digital signal to output it.

In this case, the analog-to-digital converter 630 may perform a sampling operation on the sensing signal Vo in response to the sampling clock CK, and for sampling synchronization, the flip-flop circuit 520 and the analog-to-digital converter 630 may operate in synchronization with the same sampling clock CK.

The noise removal unit 640 may calculate the touch data Dtr by subtracting a value obtained by multiplying a touch correction value Trr of a corresponding flip-flop circuit 523 by the correction coefficient "a" from the sensing signal Vo received from the analog-to-digital converter 630. This may be expressed as the following equation.

$$Dtr = Vo - a*Trr$$

Here, only the noise compensation method for the sensing channel related to the $i^{th}$ detection electrode Rxi and the $(i+1)^{th}$ detection electrode Rxi+1 has been described. However, noise compensation for the sensing channels related to the other detection electrodes may be performed in the same manner.

The correction coefficient "a" used for touch sensing compensation may be calculated through the correction coefficient calculator 320. This has been described above, and thus a detailed description thereof will be omitted here.

Those of ordinary skill in the art to which the present invention pertains will understand that the present invention may be embodied in other specific forms without changing the technical spirit or essential features thereof. Therefore, it should be understood that the embodiments described above are illustrative in all respects and not restrictive. The scope of the present invention is indicated by the following claims rather than the above detailed description, and all changes or modifications derived from the meaning and scope of the claims and their equivalent concepts should be construed as being included in the scope of the present invention.

The invention claimed is:

1. A display device having a touch sensor, comprising:
a display panel including pixels connected to data lines and scan lines, each pixel having a light emitting element;
a scan driver configured to supply scan signals to the pixels through the scan lines;
a data driver configured to receive digital image data, convert the digital image data into an analog data signal, and supply the analog data signal to the pixels through the data lines;
a data variation calculator configured to obtain variations in image data for each data channel by using the digital image data, and calculate an integrated data variation value by adding up the variations in the image data for each data channel;
a plurality of correction value calculators configured to calculate a touch correction value for each sensing channel by using the integrated data variation value;
a touch sensing unit including driving electrodes and detection electrodes that cross each other;
a touch driver configured to supply a touch driving signal to the driving electrodes; and
a plurality of touch correction circuits configured to perform noise removal for each sensing channel by using detection signals received from the touch sensing unit and the touch correction value for each sensing channel received from the correction value calculators, wherein the data variation calculator includes:

a variation detector configured to detect variations in image data for each data channel in a previous horizontal period and a next horizontal period by using the digital image data; and a variation summer configured to calculate the integrated data variation value by adding up the variations in the image data for each data channel detected by the variation detector, and wherein each of the correction value calculators includes:

a modulator configured to modulate the integrated data variation value;

an integrator configured to integrate the integrated data variation value received from the modulator for a preset period to calculate the touch correction value; and a flip-flop circuit configured to receive the touch correction value and supply the touch correction value to a corresponding touch correction circuit in response to a sampling clock.

2. The display device having the touch sensor of claim 1, wherein the modulator performs a modulation operation using the touch driving signal.

3. The display device having the touch sensor of claim 1, wherein each of the touch correction circuits includes:

an amplification unit connected to at least one detection electrode and configured to output a sensing signal reflecting a change in capacitance of the detection electrode;

an analog-to-digital converter configured to convert the sensing signal of the amplification unit into a digital sensing signal to output the digital sensing signal; and a noise removal unit configured to calculate touch data by subtracting a value obtained by multiplying the touch correction value of a corresponding flip-flop circuit by a correction coefficient from the digital sensing signal received from the analog-to-digital converter.

4. The display device having the touch sensor of claim 1, wherein each of the touch correction circuits includes:

a demodulator configured to demodulate an $i^{th}$ detection signal and an $(i+1)^{th}$ detection signal received from an $i^{th}$ detection electrode and an $(i+1)^{th}$ detection electrode adjacent to each other;

a differential amplification unit configured to receive demodulated $i^{th}$ detection signal and $(i+1)^{th}$ detection signal from the demodulator to output a sensing signal;

an analog-to-digital converter configured to convert the sensing signal into a digital sensing signal to output the digital sensing signal; and a noise removal unit configured to calculate touch data by subtracting a value obtained by multiplying the touch correction value of a corresponding flip-flop circuit by a correction coefficient from the digital sensing signal received from the analog-to-digital converter.

5. The display device having the touch sensor of claim 3, wherein the analog-to-digital converter performs a sampling operation in response to the sampling clock.

6. The display device having the touch sensor of claim 4, wherein the demodulator performs a demodulation operation of the $i^{th}$ detection signal and the $(i+1)^{th}$ detection signal by using the touch driving signal.

7. The display device having the touch sensor of claim 5, wherein the sampling clock is synchronized with a horizontal synchronization signal.

8. The display device having the touch sensor of claim 7, further comprising:

a frequency multiplier configured to receive the horizontal synchronization signal as an input signal and output the sampling clock as an output signal.

9. The display device having the touch sensor of claim 3, further comprising:

a correction coefficient calculator configured to calculate the correction coefficient.

10. The display device having the touch sensor of claim 9, wherein the correction coefficient calculator updates the correction coefficient by using a least mean square (LMS) algorithm.

11. The display device having the touch sensor of claim 9, wherein:

the display device includes dummy pixels having no light emitting element, the data variation calculator obtains variations in image data for each data channel with respect to the dummy pixels by using the digital image data during a driving period of the dummy pixels, and calculates a dummy data variation value by adding up the variations of the image data for each data channel with respect to the dummy pixels, each of the correction value calculators calculates a dummy correction value for each sensing channel by using the dummy data variation value, and the correction coefficient calculator calculates the correction coefficient for each sensing channel by using the dummy correction value for each sensing channel, a first signal outputted from the analog-to-digital converter during a driving period of the dummy pixels, and a second signal outputted from the analog-to-digital converter during a non-driving period of the pixels and the dummy pixels.

12. A display device having a touch sensor comprising:

a display panel including pixels connected to data lines and scan lines, each pixel having a light emitting element;

a scan driver configured to supply scan signals to the pixels through the scan lines;

a data driver configured to receive digital image data, convert the digital image data into an analog data signal, and supply the analog data signal to the pixels through the data lines;

a data variation calculator configured to obtain variations in image data for each data channel by using the digital image data, and calculate an integrated data variation value by adding up the variations in the image data for each data channel;

a plurality of correction value calculators configured to calculate a touch correction value for each sensing channel by using the integrated data variation value;

a touch sensing unit including driving electrodes and detection electrodes that cross each other;

a touch driver configured to supply a touch driving signal to the driving electrodes; and a plurality of touch correction circuits configured to perform noise removal for each sensing channel by using detection signals received from the touch sensing unit and the touch correction value for each sensing channel received from the correction value calculators, wherein the data variation calculator includes:

a gamma compensator configured to perform gamma correction on the digital image data with reference to a preset gamma table;

a variation detector configured to detect variations in image data for each data channel in a previous horizontal period and a next horizontal period by using the digital image data corrected by the gamma compensator; and a variation summer configured to calculate the integrated data variation value by adding up the variations of the image data for each data channel detected by the variation detector, and wherein each of the correction value calculators includes:

a filter configured to perform a digital filtering operation on the integrated data variation value;

a modulator configured to modulate the integrated data variation value transmitted through the filter;

an integrator configured to integrate the integrated data variation value received from the modulator for a preset period to calculate the touch correction value; and a flip-flop circuit configured to receive the touch correction value and supply the touch correction value to a corresponding touch correction circuit in response to a sampling clock.

13. The display device having the touch sensor of claim 4, wherein the analog-to-digital converter performs a sampling operation in response to the sampling clock.

14. The display device having the touch sensor of claim 4, further comprising:

a correction coefficient calculator configured to calculate the correction coefficient.

* * * * *